(12) United States Patent
Dibene, II et al.

(10) Patent No.: US 6,490,160 B2
(45) Date of Patent: Dec. 3, 2002

(54) VAPOR CHAMBER WITH INTEGRATED PIN ARRAY

(75) Inventors: Joseph T. Dibene, II, San Diego, CA (US); Farhad Raiszadeh, San Diego, CA (US)

(73) Assignee: INCEP Technologies, Inc., San Diego, CA (US)

( * ) Notice: Subject to any disclaimer, the term of this patent is extended or adjusted under 35 U.S.C. 154(b) by 0 days.

(21) Appl. No.: 09/921,153

(22) Filed: Aug. 2, 2001

(65) Prior Publication Data

US 2002/0021556 A1 Feb. 21, 2002

Related U.S. Application Data

(63) Continuation-in-part of application No. 09/802,329, filed on Mar. 8, 2001, and a continuation-in-part of application No. 09/801,437, filed on Mar. 8, 2001, and a continuation-in-part of application No. 09/798,541, filed on Mar. 2, 2001, and a continuation-in-part of application No. 09/785,892, filed on Feb. 16, 2001, and a continuation-in-part of application No. 09/727,016, filed on Nov. 28, 2000, and a continuation-in-part of application No. 09/432,878, filed on Nov. 2, 1999, and a continuation-in-part of application No. 09/353,428, filed on Jul. 15, 1999, now Pat. No. 6,304,450.

(60) Provisional application No. 60/304,930, filed on Jul. 11, 2001, provisional application No. 60/304,929, filed on Jul. 11, 2001, provisional application No. 60/301,753, filed on Jun. 27, 2001, provisional application No. 60/299,573, filed on Jun. 19, 2001, provisional application No. 60/292,125, filed on May 18, 2001, provisional application No. 60/291,772, filed on May 16, 2001, provisional application No. 60/291,749, filed on May 16, 2001, provisional application No. 60/287,860, filed on May 1, 2001, provisional application No. 60/277,369, filed on Mar. 19, 2001, provisional application No. 60/266,941, filed on Feb. 6, 2001, provisional application No. 60/251,184, filed on Dec. 4, 2000, provisional application No. 60/251,223, filed on Dec. 4, 2000, provisional application No. 60/251,222, filed on Dec. 4, 2000, provisional application No. 60/232,971, filed on Sep. 14, 2000, provisional application No. 60/222,407, filed on Aug. 2, 2000, and provisional application No. 60/222,386, filed on Aug. 2, 2000.

(51) Int. Cl.[7] .................................................. H05K 7/20
(52) U.S. Cl. ..................... 361/700; 361/699; 361/704; 257/714; 257/715; 174/15.2; 165/80.4; 165/104.26
(58) Field of Search ................................ 361/699, 700, 361/704, 717, 718; 257/714, 715; 174/15.1, 15.2; 165/80.4, 104.26, 104.32

(56) References Cited

U.S. PATENT DOCUMENTS 4,724,901 A * 2/1988 Munekawa ............ 165/104.21

(List continued on next page.)

FOREIGN PATENT DOCUMENTS

EP 0910235 A1 4/1999

(List continued on next page.)

OTHER PUBLICATIONS

"Pin Fin Array Heat Pipe Apparatus", IBM Technical Disclosure Bulletin, vol. 37, No. 9, Sep. 1994.

*Primary Examiner*—Boris Chervinsky
(74) *Attorney, Agent, or Firm*—Gates & Cooper LLP

(57) ABSTRACT

A heat transfer device wherein a vapor chamber is combined with a pin structure that allows the highly conductive cooling vapors to flow within the pins of a pin array maximizing the efficiency of both components of the heat sink into one unit is disclosed. In one embodiment the heat transfer device comprises a thermally conductive chamber having a first thermally conductive chamber portion having a base thermally coupleable to a heat dissipating device; a second thermally conductive chamber portion having a plurality of hollow protrusions extending away from and in fluid communication with the first thermally conductive chamber portion wherein the thermally conductive chamber comprises a fluid vaporizable when in thermal communication with the heat dissipating device and condensable when in thermal communication with the hollow protrusions.

20 Claims, 7 Drawing Sheets

U.S. PATENT DOCUMENTS

| | | | | |
|---|---|---|---|---|
| 5,198,889 A | * | 3/1993 | Hisano et al. | 257/678 |
| 5,216,580 A | * | 6/1993 | Davidson et al. | 361/700 |
| 5,386,143 A | * | 1/1995 | Fitch | 257/715 |
| 5,632,158 A | * | 5/1997 | Tajima | 62/259.2 |
| 5,647,430 A | * | 7/1997 | Tajima | 165/104.33 |
| 5,704,416 A | * | 1/1998 | Larson et al. | 165/104.33 |
| 5,864,466 A | * | 1/1999 | Remsburg | 361/700 |
| 6,062,302 A | * | 5/2000 | Davis et al. | 165/104.26 |
| 6,237,223 B1 | * | 5/2001 | McCullough | 29/890.032 |

FOREIGN PATENT DOCUMENTS

| | | | | |
|---|---|---|---|---|
| JP | 57 066 654 | | 4/1982 | |
| JP | 58 175 851 | | 10/1983 | |
| JP | 403041753 A | * | 2/1991 | 257/715 |

* cited by examiner

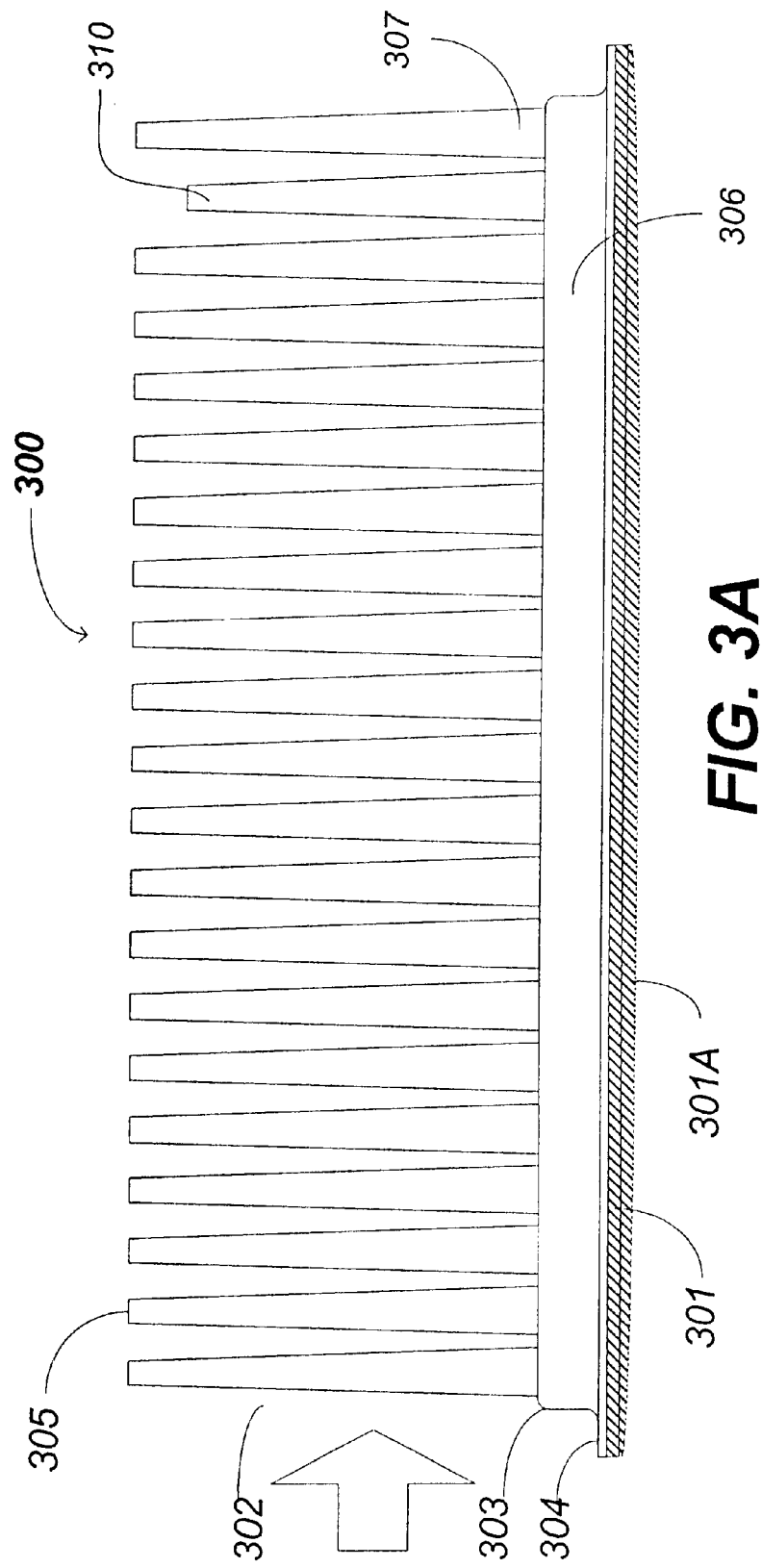

VAPOR CHAMBER WITH INTEGRATED PIN ARRAY

CROSS-REFERENCE TO RELATED APPLICATIONS

This application claims benefit of the following U.S. Provisional Patent Applications, each of which is hereby incorporated by reference herein:

application Ser. No. 60/222,386, entitled "HIGH DENSITY CIRCULAR 'PIN' CONNECTOR FOR HIGH SPEED SIGNAL INTERCONNECT", by David H. Hartke and Joseph T. DiBene II, filed Aug. 2, 2000;

application Ser. No. 60/222,407, entitled "VAPOR HEATSINK COMBINATION FOR HIGH EFFICIENCY THERMAL MANAGEMENT", by David H. Hartke and Joseph T. DiBene II, filed Aug. 2, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000;

application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by Joseph T. DiBene II, David H. Hartke, and James M. Broder, filed Feb. 6, 2001;

application Ser. No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

application Ser. No. 60/287,860, entitled "POWER TRANSMISSION DEVICE," by Joseph T. DiBene II, David H. Hartke, Carl E. Hoge, and Edward J. Derian, filed May 1, 2001;

application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II, Farhad Raiszadeh, filed May 18, 2001;

application Ser. No. 60/299,573, entitled "IMPROVED MICRO-I-PAK STACK-UP ARCHITECTURE," by Joseph T. DiBene, Carl E. Hoge, and David H. Hartke, filed Jun. 19, 2001;

application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

application Ser. No. 60/304,929, entitled "BORREGO ARCHITECTURE," by David H. Hartke and Joseph T. DiBene II, filed Jul. 11, 2001; and application Ser. No. 60/304,930, entitled "MICRO-I-PAK," by Joseph T. DiBene II, Carl E. Hoge, David H. Hartke, and Edward J. Derian, filed Jul. 11, 2001.

This patent application is also a continuation-in-part of the following co-pending and commonly assigned patent applications, each of which applications are hereby incorporated by reference herein:

application Ser. No. 09/353,428, entitled "INTER-CIRCUIT ENCAPSULATED PACKAGING," by Joseph T. DiBene II and David H. Hartke, filed Jul. 15, 1999, now U.S. Pat. No. 6,304,450, issued on Oct. 16, 2001;

application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999;

application Ser. No. 09/727,016, entitled "EMI CONTAINMENT USING INTER-CIRCUIT ENCAPSULATED PACKAGING TECHNOLOGY," by Joseph T. DiBene II and David Hartke, filed Nov. 28, 2000, which claims priority to the following U.S. Provisional Patent Applications:

application Ser. No. 60/167,792, entitled "EMI CONTAINMENT USING INTER-CIRCUIT ENCAPSULATED PACKAGING TECHNOLOGY," by Joseph T. DiBene II and David H. Hartke, filed Nov. 29, 1999;

application Ser. No. 60/171,065, entitled "INTER-CIRCUIT ENCAPSULATION PACKAGING TECHNOLOGY," by Joseph T. DiBene II and David H. Hartke, filed Dec. 16, 1999;

application Ser. No. 60/183,474, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 18, 2000;

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled "HIGH CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000.

application Ser. No. 09/785,892, entitled "METHOD AND APPARATUS FOR PROVIDING POWER TO A MICROPROCESSOR WITH INTEGRATED THERMAL AND EMI MANAGEMENT" by Joseph T. DiBene II, David H. Hartke, James J. Hjerpe Kaskade, and Carl E. Hoge, filed Feb. 16, 2001, which claims priority to the following U.S. Provisional Patent Applications:

application Ser. No. 60/183,474, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 18, 2000;

application Ser. No. 60/186,769, entitled "THERMACEP SPRING BEAM," by Joseph T. DiBene II and David H. Hartke, filed Mar. 3, 2000;

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled "HIGH CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY HIGH POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING,." By Joseph T. DiBene II, David H. Hartke, Carl E. Hoge, James M. Broder, and Joseph S. Riel filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001.

application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which claims priority to the following U.S. Provisional Patent Applications:

application Ser. No. 06/185,769, entitled "THERMACEP SPRING BEAM," Joseph T. DiBene II and David H. Hartke, filed Mar. 3, 2000;

application Ser. No. 60/183,474, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 18, 2000;

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled "HIGH CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEATSINK COMBINATION FOR HIGH EFFICIENCY THERMAL MANAGEMENT," by David H. Hartke and Joseph T. DiBene II, fled Aug. 2, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Cad E. Hoge, filed Dec. 4, 2000;

application Ser. No. 60/251,184, entitled "MICROPROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001.

application Ser. No. 09/801,437, entitled "METHOD AND APPARATUS FOR DELIVERY POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001, which claims priority to the following U.S. Provisional Patent Applications:

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled "HIGH CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE" by David H. Hartke, James M. Broder and Joseph T. DiBene II, filed Feb. 6, 2001.

application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE," by Joseph T. DiBene II and David H. Hartke, filed Mar. 8, 2001, which claims priority to the following U.S. Provisional Patent Applications:

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled "HIGH CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE" by David H. Hartke, James M. Broder and Joseph T. DiBene II, filed Feb. 6, 2001.

application Serial No., 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS," by Joseph T. DiBene II, David H. Hartke, Wendell C. Johnson, Farhad Raiszadeh, Edward J. Darien and Jose B. San Andres, filed Jul. 20, 2001, which claims priority to the following U.S. Provisional Patent Applications:

application Ser. No. 60/219,506, entitled "HIGH PERFORMANCE THERMAL/MECHANICAL INTERFACE," by Joseph T. DiBene II, David H. Hartke, and Wendell C. Johnson, filed Jul. 20, 2000;

application Ser. No. 60/219,813, entitled "HIGH CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000;

application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by Joseph T. DiBene II, David H. Hartke, and James M. Broder, filed Feb. 6, 2001;

application Ser. No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

application Ser. No. 60/287,860, entitled "POWER TRANSMISSION DEVICE," by Joseph T. DiBene II, David H. Hartke, Carl E. Hoge, and Edward J. Derian, filed May 1, 2001;

application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, Filed May 18, 2001;

application Ser. No. 60/299,573, entitled "IMPROVED MICRO-I-PAK STACK-UP ARCHITECTURE," by Joseph T. DiBene II, Carl E. Hoge, and David H. Hartke, filed Jun. 19, 2001;

application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

application Ser. No. 60/304,929, entitled "BORREGO ARCHITECTURE," by David H. Hartke and Joseph T. DiBene II, filed Jul. 11, 2001; and application Ser. No. 60/304,930, entitled "MICRO-I-PAK," by Joseph T. DiBene II, Carl E. Hoge, David H. Hartke, and Edward J. Derian, filed Jul. 11, 2001.

application Ser. No. 09/921,152, entitled "HIGH SPEED AND DENSITY CIRCULAR CONNECTOR FOR BOARD-TO-BOARD INTERCONNECTION SYSTEMS," by Joseph T. DiBene II and David H. Hartke, filed on Aug. 2, 2001, which claims priority to the following U.S. Provisional Patent Applications:

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000;

application Ser. No. 60/219,813, entitled "HIGH CURRENT MICROPROCESSOR POWER DELIVERY SYSTEMS," by Joseph T. DiBene II, filed Jul. 21, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000;

application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE" by David H. Hartke, James M. Broder and Joseph T. DiBene II, filed Feb. 6, 2001;

application Ser. No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

application Ser. No. 60/287,860, entitled "POWER TRANSMISSION DEVICE," by Joseph T. DiBene II, David H. Hartke, Carl E. Hoge, and Edward J. Derian, filed May 1, 2001;

application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

application Ser. No. 60/299,573, entitled "IMPROVED MICRO-I-PAK STACK-UP ARCHITECTURE," by Joseph T. DiBene II, Carl E. Hoge, and David H. Hartke, filed Jun. 19, 2001;

application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

application Ser. No. 60/304,929, entitled "BORREGO ARCHITECTURE," by David H. Hartke and Joseph T. DiBene II, filed Jul. 11, 2001; and application Ser. No. 60/304,930, entitled "MICRO-I-PAK," by Joseph T. DiBene II, Carl E. Hoge, David H. Hartke, and Edward J. Derian, filed Jul. 11, 2001.

BACKGROUND OF THE INVENTION

1. Field of the Invention

The present invention relates generally to systems and methods for cooling electronic components, and in particular to a heat transfer device having a chamber thermally coupled to the component and in fluid communication with a second chamber having hollow protrusions.

2. Description of the Related Art

High performance electronic devices typically generate large amounts of heat due to their power consumption requirements. To dissipate the heat generated from such devices a large heatsink is usually attached to their surface through a thermal interface material (TIM). In order to efficiently transmit heat from the device (or devices), which is usually a concentrated heat source, a heat sink is employed. Such heat sinks often consist of a large base structure that is highly conductive and a finned or pinned structure that is used to couple the thermal energy from the base structure to the cooling medium which is generally air. Ideally, the base structure should transmit the thermal energy with zero loss so that the finned or pinned structure which is much more efficient at transferring thermal energy to the cooling medium can operate at maximum efficiency. Thus, the base structure of a heat sink commonly utilizes copper or aluminum because these metals have excellent thermal conductivity, e.g., 200 to 400 W/m-K. However, in highly demanding cooling applications even the use of large base structures employing highly conductive metals is not adequate. In such cases, use is often made of vapor chambers to provide highly efficient distribution of heat from the concentrated heat source to the distributed fin structure. Such vapor chambers often have internal thermal conductivities exceeding 50,000 W/m-K. However, even though the heat may be efficiently transported to the fin structure using vapor chambers the individual pins or fins still have thermal conduction losses which reduce their ability to operate at maximum efficiency in transferring the thermal energy to the cooling medium. What is needed is a device that allows the flow of highly conductive cooling vapors between the pin/fin array and the vapor chamber to maximize the efficiency. The present invention satisfies that need.

SUMMARY OF THE INVENTION

To address the needs described above, the present invention discloses a heat transfer device wherein a vapor chamber is combined with a pin structure that allows the highly conductive cooling vapors to flow within the pins of a pin array maximizing the efficiency of both components of the heat sink into one unit. In one embodiment the heat transfer device comprises a thermally conductive chamber having a first thermally conductive chamber portion having a base thermally coupleable to a heat dissipating device; a second thermally conductive chamber portion having a plurality of hollow protrusions extending away from and in fluid communication with the first thermally conductive chamber portion wherein the thermally conductive chamber comprises a fluid vaporizable when in thermal communication with the heat dissipating device and condensable when in thermal communication with the hollow protrusions. The method comprises the steps of forming a first portion defining a thermally conductive chamber having a first thermally conductive chamber portion and a second thermally conductive chamber portion having a plurality of hollow protrusions extending away from and in fluid communication with the first thermally conductive chamber portion; inserting a wick structure in the first portion; coupling a base to the first portion; and inserting a working fluid into the thermally conductive chamber.

The present invention enables a highly efficient transmission of thermal energy from a concentrated heat source such as an electronic circuit assembly to an array of pin fins or other fin arrays that are designed to efficiently couple and transfer that energy to air or other vapors or fluids. This energy transference is accomplished by combining the prior art of vapor chambers and heatpipes into one efficient and economical assembly in which the thermal transmission to all surfaces of the pin array is accomplished with minimum thermal resistance, thus, maximizing the thermal transmission to the air or other vapors or fluids.

BRIEF DESCRIPTION OF THE DRAWINGS

Referring now to the drawings in which like reference numbers represent corresponding parts throughout:

FIG. 3A is a diagram depicting a side view of the vapor chamber and integrated pin array of one embodiment of the present invention;

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Heatpipes are used to transfer heat in a passive mode. This technology has been used extensively for many decades, especially in space applications.

Figure 1:
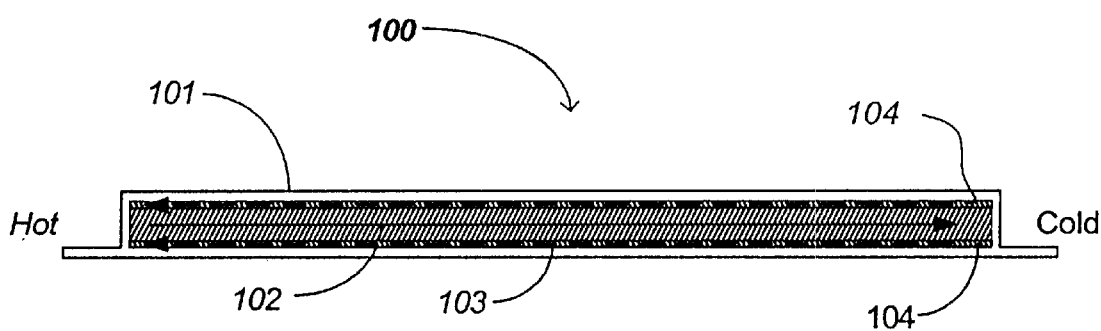
FIG. 1 is a drawing showing a heatpipe in a section view.

FIG. 1 is a diagram illustrating a heat pipe 100. The heat pipe 100 is constructed of a hollow tube 101 having inside walls and is provided with a wick structure 104. The heat pipe 100 is evacuated and charged with a working fluid which can boil at normal operating temperatures. When heat is applied to the hot end (evaporation area) of the heat pipe 100, the working fluid disposed therein boils. The energy that is used to cause the working fluid to boil is referred to as the latent heat of vaporization $L_v$ and represents a heat loss from the hot end of the heat pipe. The vapor 102 resulting from the boiling of the working fluid travels down the hollow tube 101 to the cold end (condensation area) where the vapor condenses and releases its latent heat energy. The condensed fluid 103 returns down the hollow tube 101 tube through the wick structure 104 to the hot end where the heat transfer cycle begins anew. The wick structure 104 is a physical structure that entraps the condensed fluid and allows the fluid to travel back down the heatpipe 100 to the evaporation point (hot end). The working fluid must be compatible with the desired operating temperature. As an example, water is a useful fluid when the operating temperature is approximately +10 to +200° C. whereas, ammonia is a useful fluid when the operating temperature is approximately −60 to +60° C. The advantage of heatpipes is that they can achieve an effective thermal conductivity often 100 times greater than an equivalent high conductivity metals such as copper.

Figure 2:
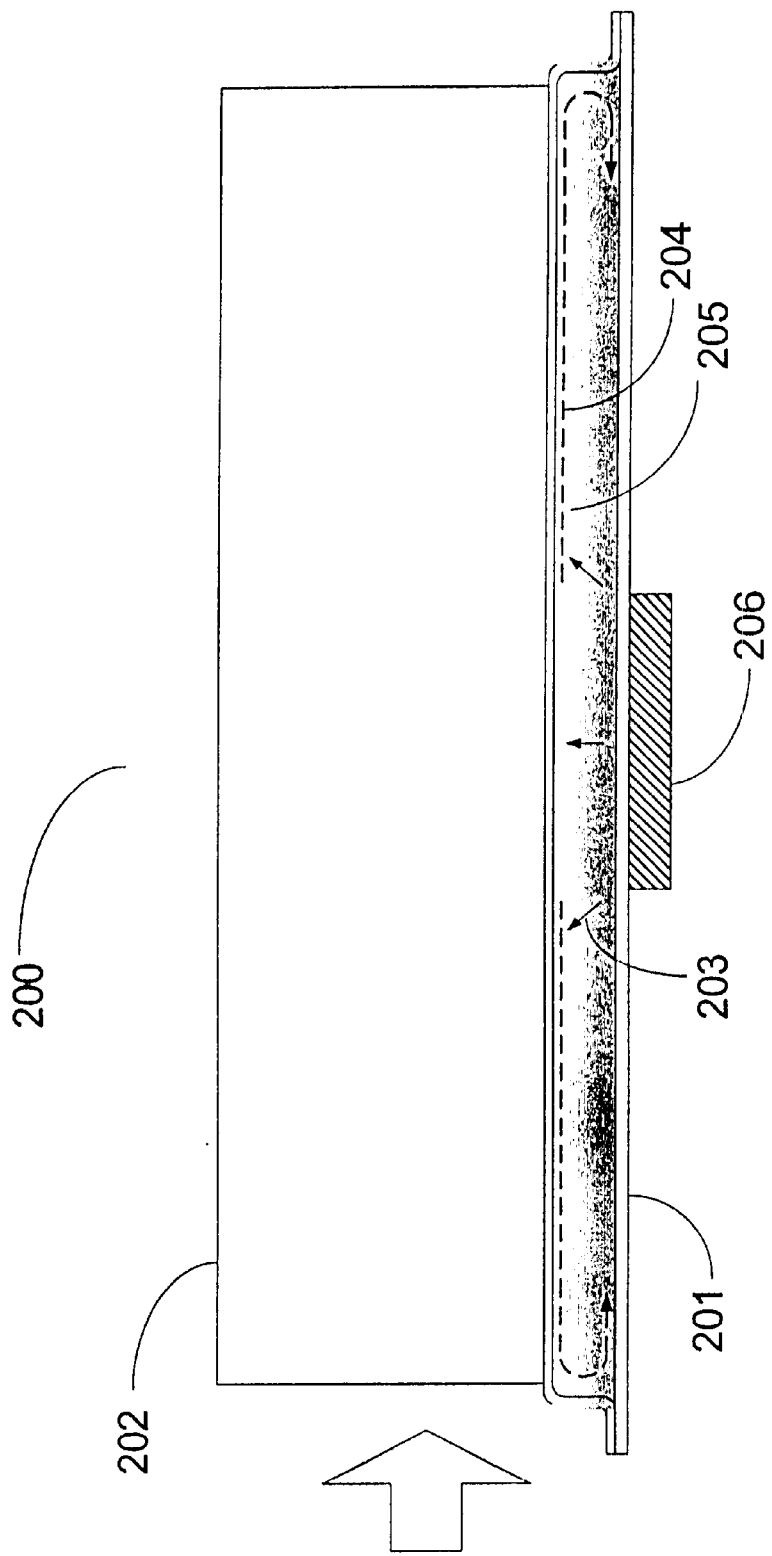
FIG. 2 is a drawing shows a vapor chamber in conjunction with a finned structure useful for dissipating thermal energy to air and an electronic circuit thermally coupled to the vapor chamber.

FIG. 2 illustrates a special case of a heatpipe application 200 wherein a heatpipe is expanded into a chamber structure which is commonly referred to as a vapor chamber 201. Mounted to the top of the vapor chamber 201 is a finned structure 202 which is used to efficiently transfer heat from the top of the vapor chamber 201 to air, often in a forced flow mode (air forced through the fins via a fan or similar device). A heat dissipating device or circuit 206 such as a processor is disposed at the bottom of the vapor chamber 201 thus thermally coupling the device 206 to the base of the vapor chamber 201. The vapor chamber 201 serves to efficiently distribute the heat from device 206 to all points of the finned structure 202 (rather than concentrating the heat in the area near the device 206) permitting the finned structure 202 to much more efficiently remove heat from electronic circuit 206. As in the heatpipe 100 example, the vapor chamber 201 is constructed of a hollow chamber in which the entire inside volume of the vapor chamber 201 is outfitted with a wick structure 205. The chamber is evacuated and charged with a working fluid which boils at normal operating temperatures. In the case of electronic circuits such as 206 this is often distilled water. As electronic circuit 206 dissipates heat it causes the working fluid to boil and evaporate. The resultant vapor 203 travels to the cooler section of the chamber which in this case is the top where the finned structure 202 is located. At this point the vapor condenses giving off its latent heat energy. The condensed fluid 204 now returns down through the wick structure 205 to the bottom of the chamber nearest the electronic circuit 206 where a new cycle occurs.

FIG. 3A is a diagram depicting a side view of the heat transfer device 300. The heat transfer device 300 encloses a thermally conductive chamber having two portions. The first thermally conductive chamber portion 306 is a vapor chamber formed by an upper portion 303 and a lower cap, lid or base 301, which may be non-planar, as generally illustrated as 301A. The base 301 can be attached to the upper portion 303 via a lip 304. This can be accomplished by bonding, gluing, welding, soldering, or similar methods. The second thermally conductive chamber portion 307 is formed by a plurality of hollow protrusions such as an array of pins and/or fins 305 extending away from and in fluid communication with the first thermally conductive chamber portion 306. The thermally conductive chamber comprises a working fluid vaporizable when in thermal communication with an operational heat dissipating device and condensable when in thermal communication with the hollow protrusions 305.

In one embodiment, the upper portion of the assembly 302 is formed out of one piece of material, e.g., copper or some composite material, with the pin/fin array 305 deep drawn from the parent material creating hollow pins open to the common vapor chamber. The lower cap 301 is generally made out of a thermally conductive material as that used for assembly 302. Cooling air or other vapor or fluid is passed through the pin array 305 on the outside (e.g. in the direction of the arrow), as shown, to transfer thermal energy from an electronic circuit 206 coupled to the base of the assembly 300 (not shown), said thermal energy being efficiently coupled from the electronic circuit by way of the vapor chamber portion of 300 and up through the hollow pin array 305 with a common vapor cycle.

Figure 3B:
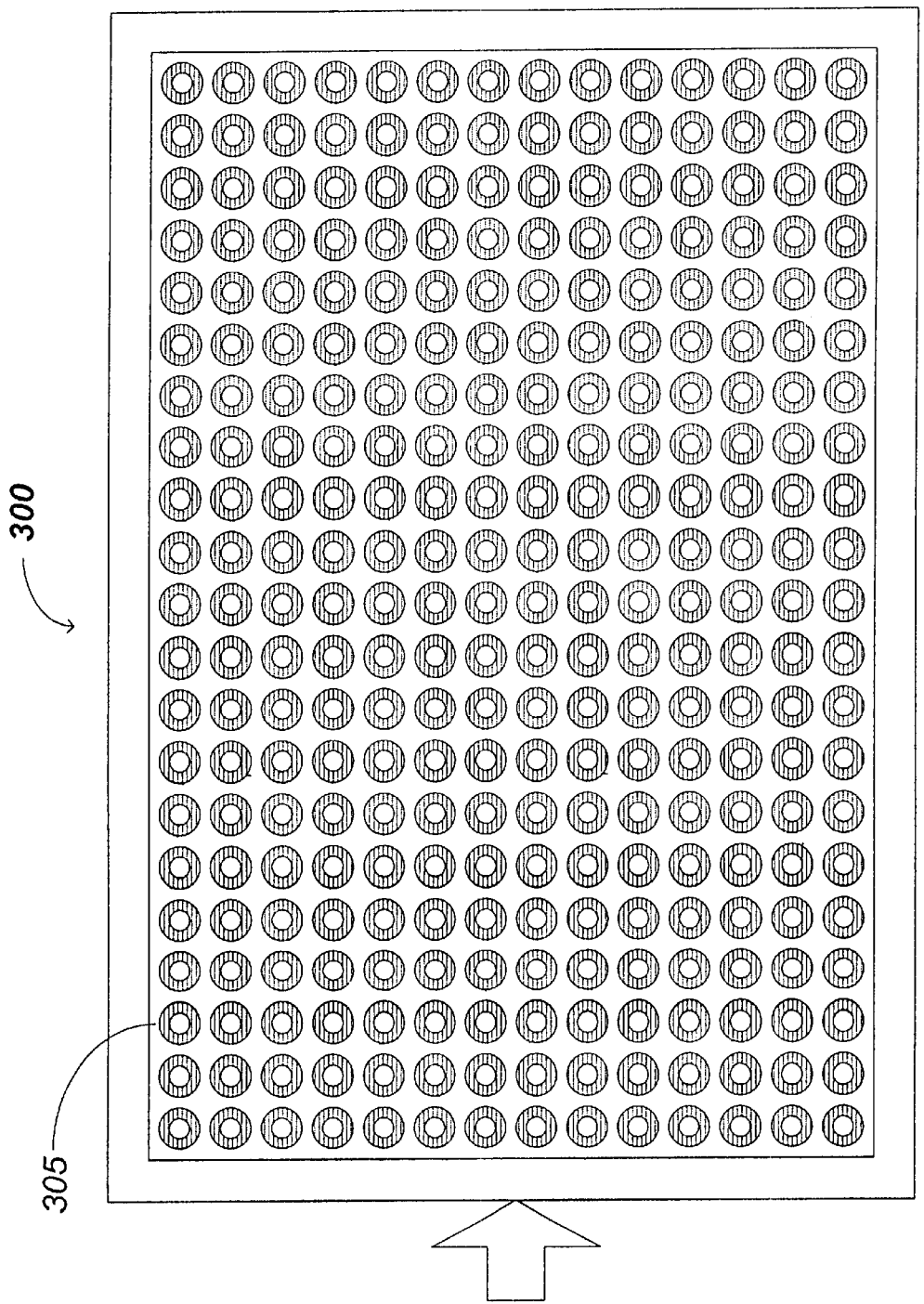
FIG. 3B is a diagram depicting a top view of the vapor chamber and integrated pin array of one embodiment of the present invention.

FIG. 3B shows a top view of the assembly 300 illustrating one embodiment of the pin/fin array 305.

Figure 4:
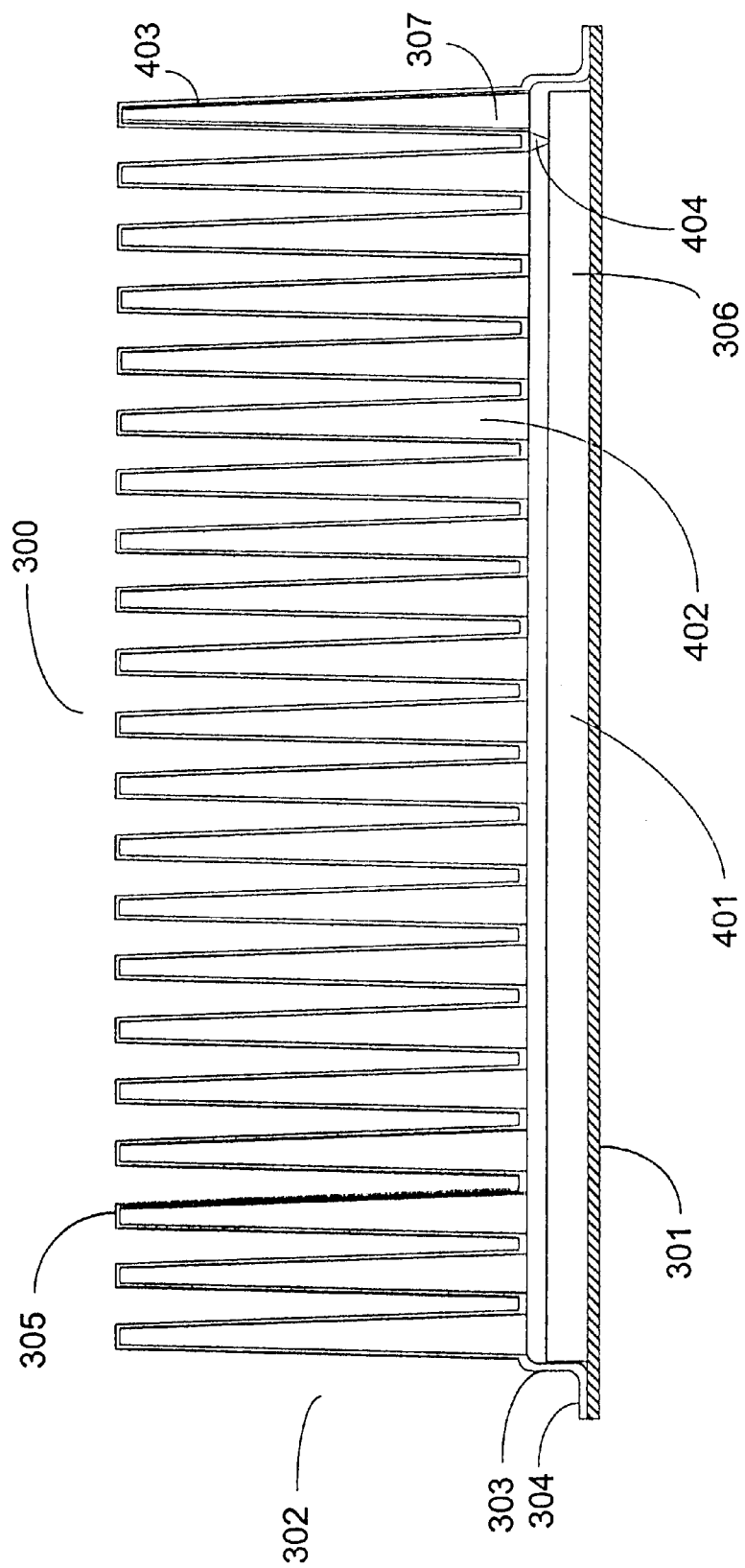
FIG. 4 is a diagram depicting a section view of the vapor chamber and integrated pin array of one embodiment of the present invention.

FIG. 4 is a diagram depicting a section of the heatsink assembly 300 illustrating how the second chamber portion 307 formed by the hollow protrusions or pins 305 have access to a common vapor chamber 306 formed by the base of 302 and the lower lid 301 which is welded at lip 304. A wick structure 401 is inserted into the chamber to aid in returning the condensed vapors (liquids) back to the base of the chamber wherein an electronic circuit (not shown) is coupled to the base. Common wick structures include of sintered metals, meshed wire, and fluted grooves. One or more of the hollow protrusions 305 can be provided with a wicking structure 403 that aids in returning the condensed gases (liquids) back to the main chamber 306. This wicking structure 403 can comprise a separate material which is applied to the interior wall of the protrusion 305 or may be an integral part of the interior wall by the formation of fluted structures or other geometries which assist the condensed vapors to return back down the interior wall of the pin 305 and to the main vapor chamber 306.

Figure 5:
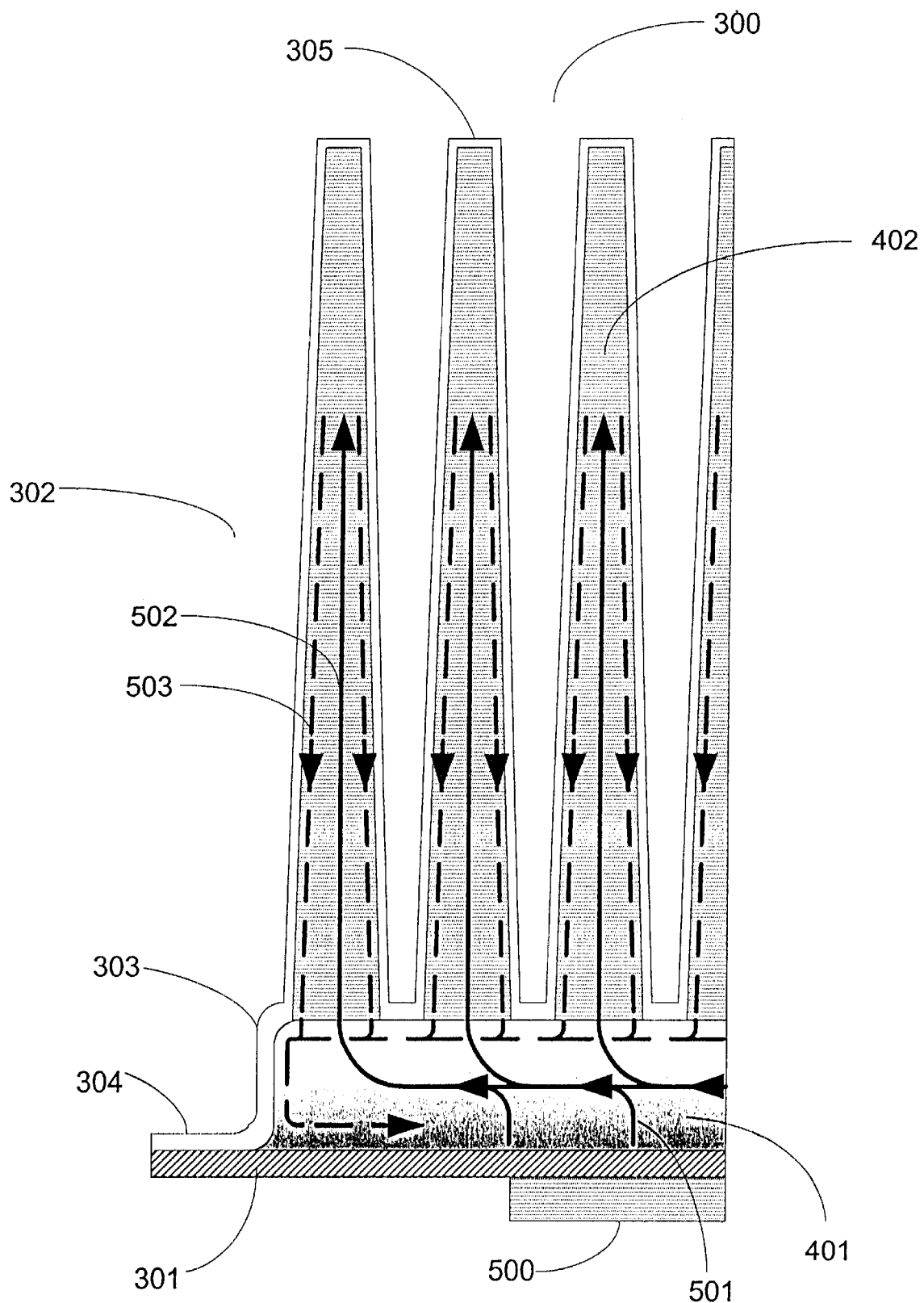
FIG. 5 is a drawing of a detail section view of the vapor chamber and integrated pin array illustrating the operation thereof.

FIG. 5 is a drawing of a detail section view of the vapor chamber and integrated pin array illustrating the operation thereof. Electronic circuit assembly 500 which is thermally coupled to the base 301 of the heat transfer device 300 generates heat which vaporizes liquid working fluid near the base 301. This vaporized fluid 501 flows to the cooler parts of the first chamber portion 306 and up though the second chamber portion 307 formed by the hollow protrusions 305 as shown. When the vapor ultimately comes into contact with the cooler interior surfaces of the hollow protrusions 305 (which are being cooled by external air, vapors, or fluids) the working fluid condenses back to a liquid 503 and travels back down the interior wall 402 of the pin 305 and through the wicking structure 403 (such as that which is illustrated in FIG. 4) and 401 in the first chamber portion 306 finally returning to the source of the heat thus completing the cycle.

In one embodiment of the present invention, an intermediate wicking structure 404 is also used to facilitate the transfer of the condensed working fluid from the pin wicking structure 403 to the main chamber wicking structure 401.

Figure 6:
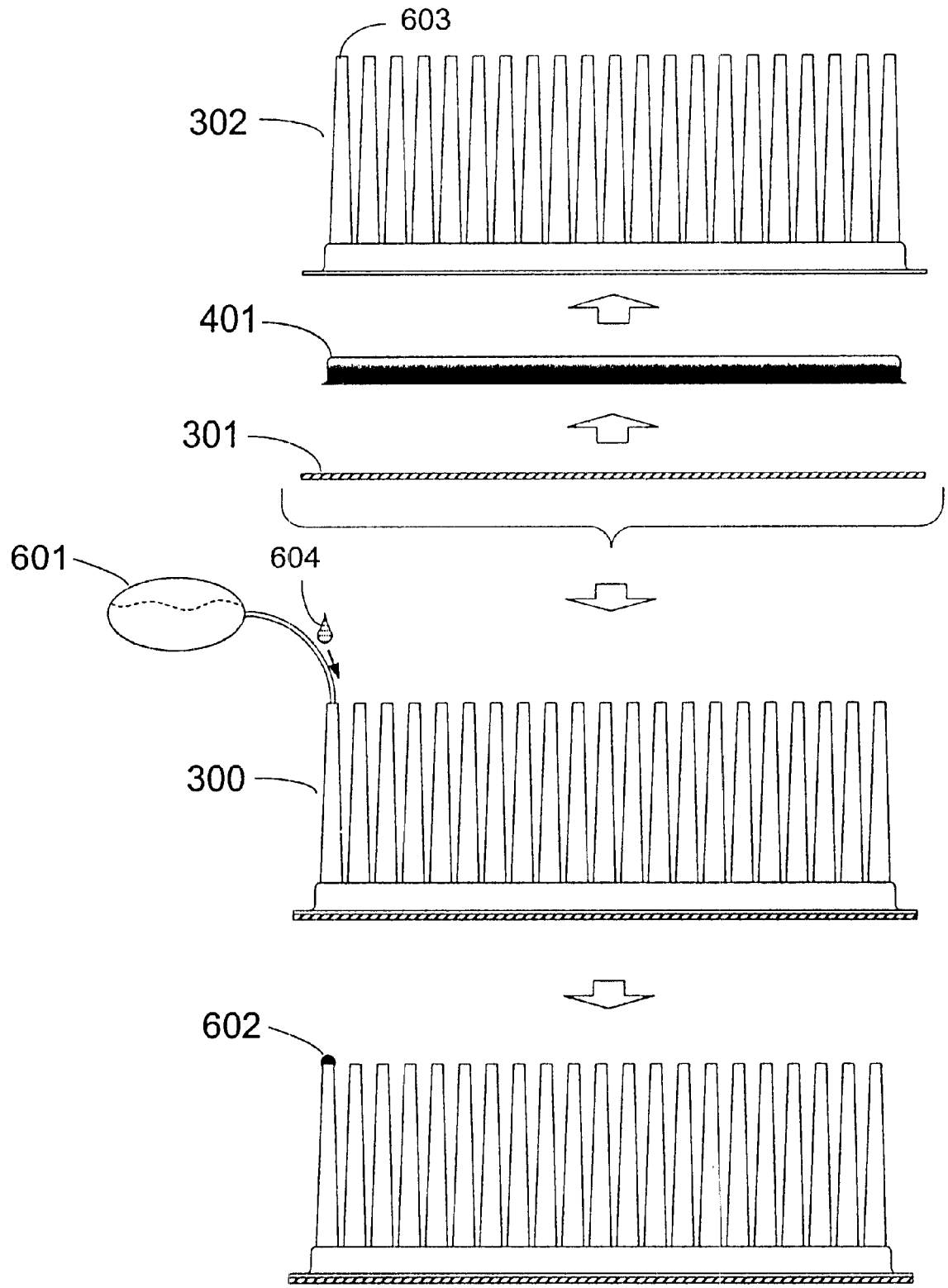
FIG. 6 is a drawing showing a method for assembling one embodiment of the present invention.

FIG. 6 is a diagram illustrating one method for fabricating and assembling one embodiment of the heat transfer device 300. The upper portion 302 is formed. The upper portion 302 can be deep drawn out of copper or other suitable materials. Then, a wick structure 401 (which may be pre-formed) is inserted into the lower chamber of 302. A lower lid 301 (also made of copper or other suitable material) is coupled (by welding, bonding, or other method) to upper portion 302. Next, the thermally conductive chamber 306, 307 of the heat transfer device 300 is evacuated through an aperture or opening 603 in the top of one of the pins 305 (or through the base 301 of the chamber 306). Then, a prescribed amount of working fluid 604 is injected into the thermally conductive chamber 306, 307. This can be accomplished with an insertion device 601 having a needle-like structure inserted into the opening 603. Finally, sealant 602, e.g., solder, is used to seal off the hole used to evacuate and dispense fluid into assembly 300. This completes the assembly process.

If desired, a vacuum can be maintained in the thermally conductive chamber 306, 307 to aid in the injection of the working fluid 604. In this case, the needle structure can be sealed with the opening 603 to maintain the vacuum during the fluid insertion process. Also, the upper portion 302 can be formed with an imbedded wicking structure 403 such as a groove. Further, a number of the hollow protrusions (e.g. 310) can differ dimensionally from a second number of the hollow protrusions 305, as shown in FIG. 3A.

CONCLUSION

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A heat transfer device, comprising:
   a thermally conductive chamber having:
      a first thermally conductive chamber portion having a base thermally coupleable to a heat dissipating device; and
      a second thermally conductive chamber portion having a plurality of tapered hollow pins extending away from and in fluid communication with the first thermally conductive chamber portion, the pins configured to transfer thermal energy by convection, wherein at least one of the tapered hollow pins comprises a fluted wicking structure integral with an interior wall of the tapered hollow pin;
   wherein the thermally conductive chamber is configured to contain a fluid vaporizable when in thermal communication with the heat dissipating device and condensable when in thermal communication with the hollow pins.

2. The apparatus of claim 1, wherein the first thermally conductive chamber portion includes a wicking structure for transferring condensed fluid to the base.

3. The apparatus of claim 1, wherein the hollow pins comprise a conical shape.

4. The apparatus of claim 1, wherein the hollow pins are curvilinear.

5. The apparatus of claim 1, wherein at least a first number of the hollow pins differ dimensionally from a second number of the hollow pins.

6. The apparatus of claim 1, wherein the thermally conductive chamber is drawn from a thermally conductive metal.

7. The apparatus of claim 1, wherein the thermally conductive chamber is molded from a thermally conductive malleable material.

8. The apparatus of claim 1, wherein the thermally conductive chamber is sealed with a non-fluid-permeable material.

9. The apparatus of claim 1, wherein the base is metallurgically bonded to the first thermally conductive chamber portion.

10. The apparatus of claim 1, wherein the base is non-planar.

11. The apparatus of claim 1, wherein at least one of the hollow pins comprises an aperture for inserting the fluid.

12. The heat transfer device of claim 1, further comprising:
   an intermediate wicking structure for transferring condensed working fluid from the fluted wicking structure to a second wicking structure disposed in the first thermally conductive chamber portion.

13. A method of assembling a heat transfer device, comprising the steps of:
   forming a first portion defining a thermally conductive chamber having a first thermally conductive chamber portion and a second thermally conductive chamber portion having a plurality of hollow tapered pins extending away from and in fluid communication with the first thermally conductive chamber portion, the pins configured to transfer thermal energy by convection, wherein at least one of the tapered hollow pins comprises a fluted wicking structure integral with an interior wall of the tapered hollow pin;
   coupling a base to the first portion; and
   inserting a working fluid into the thermally conductive chamber.

14. The method of claim 13, wherein the first portion is deep drawn.

15. The method of claim 14, wherein the first portion comprises copper.

16. The method of claim 13, wherein the wick structure is pre-formed.

17. The method of claim 13, wherein the step of inserting a working fluid into the thermally conductive chamber comprises the steps of:
   evacuating air from the thermally conductive chamber via an opening in the first portion;
   sealingly inserting an insertion device in the opening;
   inserting the working fluid through the opening with the insertion device; and
   sealing the opening.

18. The method of claim 17, wherein the opening is in one of the hollow pins.

19. A heat transfer device, comprising:
   a thermally conductive chamber thermally coupleable to a heat dissipating device, the thermally conductive chamber configured to contain a working fluid vaporizable when in thermal communication with the heat dissipating device, the thermally conductive chamber comprising:
a first thermally conductive chamber portion having a base thermally coupleable to the heat dissipating device;
an array of hollow tapered pins extending away from and in fluid communication with the first thermally conductive chamber portion, the hollow pins for condensing the vaporized working fluid and for transferring thermal energy from the condensed working fluid to air; and
wherein at least one of the tapered hollow pins comprises a fluted wicking structure integral with an interior wall of the tapered hollow pin.

20. The heat transfer device of claim 19, further comprising:
an intermediate wicking structure for transferring condensed working fluid from the fluted wicking structure to a second wicking structure disposed in the first thermally conductive chamber portion.

* * * * *